United States Patent
Chung et al.

(10) Patent No.: US 7,413,848 B2
(45) Date of Patent: Aug. 19, 2008

(54) METHOD OF REMOVING PHOTORESIST AND PHOTORESIST REWORK METHOD

(75) Inventors: Lien-Sheng Chung, Hsinchu (TW); Chi-Hung Wei, Hsinchu (TW); Hsin-Hsu Lin, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 372 days.

(21) Appl. No.: 11/161,209

(22) Filed: Jul. 27, 2005

(65) Prior Publication Data

US 2007/0026340 A1    Feb. 1, 2007

(51) Int. Cl.
*G03C 5/00* (2006.01)

(52) U.S. Cl. .......... 430/329; 430/331; 510/175; 510/176

(58) Field of Classification Search .......... 430/329, 430/331; 510/175, 176
See application file for complete search history.

(56) References Cited

U.S. PATENT DOCUMENTS

| | | | | |
|---|---|---|---|---|
| 5,362,608 A | * | 11/1994 | Flaim et al. | 430/327 |
| 5,378,315 A | * | 1/1995 | Hendrix et al. | 216/92 |
| 5,637,442 A | * | 6/1997 | Bhatt et al. | 430/311 |
| 6,127,097 A | * | 10/2000 | Bantu et al. | 430/315 |
| 6,140,027 A | * | 10/2000 | Baik et al. | 430/331 |
| 6,159,646 A | * | 12/2000 | Jeon et al. | 430/30 |
| 6,432,209 B2 | * | 8/2002 | Sahbari | 134/3 |
| 6,444,557 B1 | * | 9/2002 | Biolsi et al. | 438/597 |
| 6,929,901 B2 | * | 8/2005 | Lui et al. | 430/329 |
| 7,011,935 B2 | * | 3/2006 | Schlicht et al. | 430/329 |
| 7,122,484 B2 | * | 10/2006 | Perng et al. | 438/765 |
| 2002/0068244 A1 | * | 6/2002 | Machac et al. | 430/331 |
| 2004/0229762 A1 | * | 11/2004 | Rutter, Jr. | 510/175 |
| 2006/0110690 A1 | * | 5/2006 | Haraguchi et al. | 430/331 |

* cited by examiner

*Primary Examiner*—Amanda C. Walke
(74) *Attorney, Agent, or Firm*—Jianq Chyun IP Office

(57) ABSTRACT

A method of removing photoresist is provided. In the whole process of removing the photoresist, plasma is not used. Instead, a first solution is used in a first removal step to remove a photoresist layer. Then, a second solution is used in a second removal step to completely remove the photoresist layer. The first solution and the second solution have different polarities, and the polarity of the first solution is large than that of the second solution.

16 Claims, 3 Drawing Sheets

METHOD OF REMOVING PHOTORESIST AND PHOTORESIST REWORK METHOD

BACKGROUND OF THE INVENTION

1. Field of the Invention

The present invention relates to a photolithographic process, and more particularly, to a method of removing photoresist and a photoresist rework method.

2. Description of the Related Art

Photoresist is an indispensable material for a photolithographic process and is also one of the most critical factors in semiconductor technology. In a photolithographic process, a pattern on a mask is transferred to a photoresist layer which has different dissolution rates to a chemical solution before and after an exposure process. The mask formed by the photoresist should be removed after a subsequent process, such as a dry etch process, a wet etch process, or an ion implantation process is performed. Accordingly, the following process after the removal process will not be affected. Thus, how to fast clean photoresist without leaving residue and to reduce the manufacturing costs has become an essential research topic in the semiconductor industry.

For the time being, the method of removing photoresist comprises the dry photoresist removal method by using plasma to strip photoresist. In this method, oxygen plasma reacts with photoresist to generate carbon monoxide, carbon dioxide and water; then they are pumped out by a vacuum system. The dry photoresist removal method has been widely applied to the present process. In order to completely remove photoresist, a wet photoresist removal method may further be carried out after the dry photoresist removal method to remove ash and other particles left by the plasma reaction. Traditionally, the wet photoresist removal method uses organic solution to destroy the structure of the photoresist so that the photoresist dissolves in the organic solution and is removed.

Most of the traditional photoresist removal methods are performed in areas that are separate from the general photolithography area. The photoresist removal step cannot be immediately performed in such process as wafers should be transferred to the photoresist-removal area for processing. The process to perform these steps in different areas is troublesome and affects the manufacturing throughput.

In another aspect, if defects are found before the photolithographic processes such as photoresist coating, exposure, baking or development, ultraviolet curing or plasma bombardment, rework is required to remove photoresist in order to avoid any impacts of the subsequent processes. However, the present semiconductor process requires transferring the defective wafers to the photoresist-removal areas for reworking process before the photoresist removal process is performed. Since the rework can not be directly carried out in a manufacturing process, the method is very time consuming and costly.

SUMMARY OF THE INVENTION

Accordingly, the present invention is directed to a method of removing photoresist. Without using plasma, photoresist can be completely removed. The process time is thus reduced, and the manufacturing costs are also lowered.

The present invention is also directed to a photoresist rework method to completely remove photoresist. Accordingly, the process time is reduced, and the manufacturing costs are also lowered.

The present invention provides a method of removing photoresist. During the whole process of this method, photoresist is removed without using plasma. A first solution is used to perform a first removal step to a photoresist layer. Then, a second solution is used to perform a second removal step to the photoresist layer so as to completely remove the photoresist layer. The first solution and the second solution have different polarities.

According to an embodiment of the present invention, a polarity of the first solution is larger than a polarity of the second solution. Both of the first solution and the second solution are solutions with organic solvents. The organic solvent of the first solution can be, for example, N-methyl-2-pyrrolidone (NMP). The organic solvent of the second solution can be, for example, cyclopentanone. Additionally, a temperature of the first solution of the first removal step is between about 23° C. and 50° C., and a temperature of the second solution of the second removal step is between about 23° C. and 50° C.

The present invention also provides a photoresist rework method. The method is adapted for a substrate with a defective photoresist layer thereon. During the whole process of this method, photoresist is removed without using plasma. A first solution is used to perform a first removal step to the defective photoresist layer. Then, a second solution is used to perform a second removal step to the defective photoresist layer so as to completely remove the defective photoresist layer. The first solution and the second solution have different polarities. After the removal of the defective photoresist layer, a new photoresist layer is formed over the substrate.

According to an embodiment of the present invention, a polarity of the first solution is larger than a polarity of the second solution. Both of the first solution and the second solution are solutions with organic solvents. The organic solvent of the first solution can be, for example, N-methyl-2-pyrrolidone (NMP). The organic solvent of the second solution can be, for example, cyclopentanone. Additionally, a temperature of the first solution of the first removal step is between about 23° C. and 50° C., and a temperature of the second solution of the second removal step is between about 23° C. and 50° C.

The present invention performs two-time solution processes, in which the two solutions have different polarities to remove photoresist completely. These solutions are chemical solutions used in general processes. The manufacturing costs can be thus reduced. In addition, in the method of removing photoresist, plasma is not required and photoresist can be completely removed. The process time also is shortened. The manufacturing costs can be further reduced. Furthermore, the process of removing photoresist of the present invention can be performed in a photolithography area without transferring wafers to other areas. The process time can be reduced and the throughput is increased.

The above and other features of the present invention will be better understood from the following detailed description of the preferred embodiments of the invention that is provided in communication with the accompanying drawings.

DESCRIPTION OF SOME EMBODIMENTS

Figure 1:
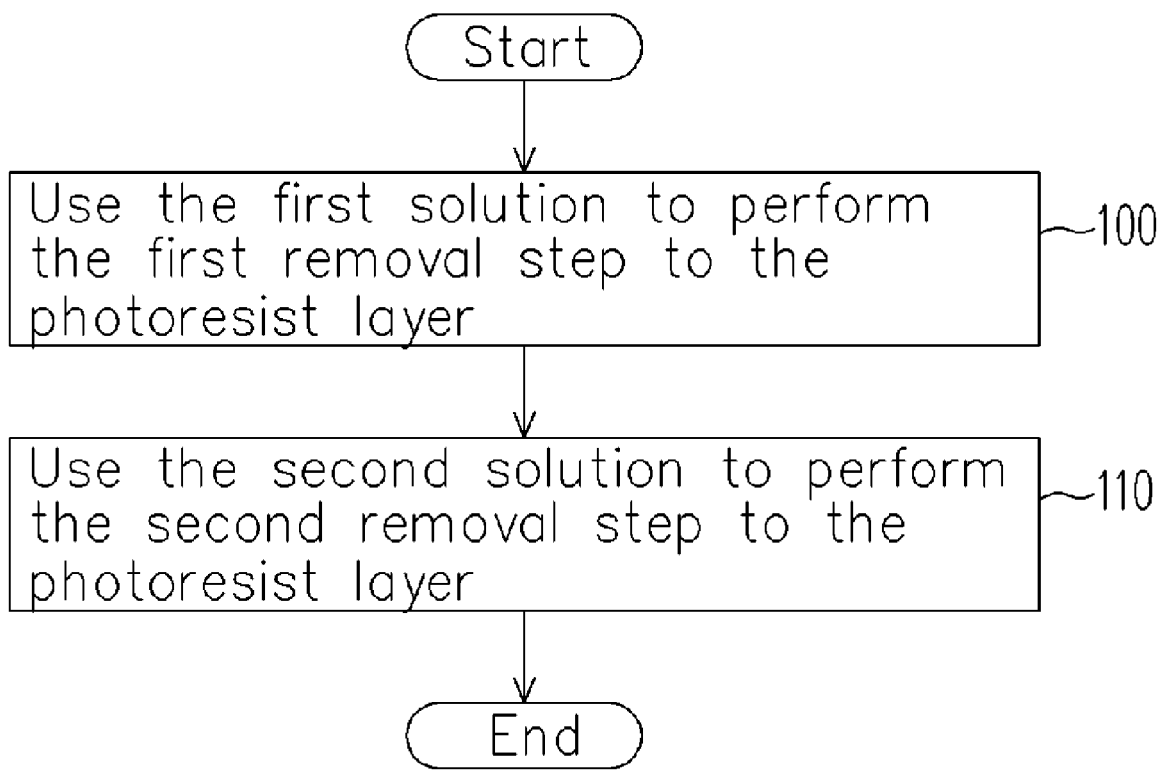
FIG. 1 is a flowchart of a method of removing photoresist according to an embodiment of the present invention.

FIG. 1 is a flowchart of a method of removing photoresist according to an embodiment of the present invention.

Referring to FIG. 1, a first solution is used to perform a first removal step to a photoresist layer in step 100. In this step, the first solution can be a solution with an organic solvent.

In step 110, a second solution is used to perform a second removal step to the photoresist layer so as to completely the photoresist layer. The second solution can be a solution with an organic solvent.

In steps 100 and 110, the polarity of the first solution is different from that of the second solution. Moreover, the polarity of the first solution is larger than that of the second solution. The organic solvent of the first solution can be, for example, N-methyl-2-pyrrolidone (NMP). The organic solvent of the second solution can be, for example, cyclopentanone. In an embodiment, the temperature of the first solution of the first removal step is between about 23° C. and 50° C. and the temperature of second solution of the second removal step is between about 23° C. and 50° C.

Figure 2A:
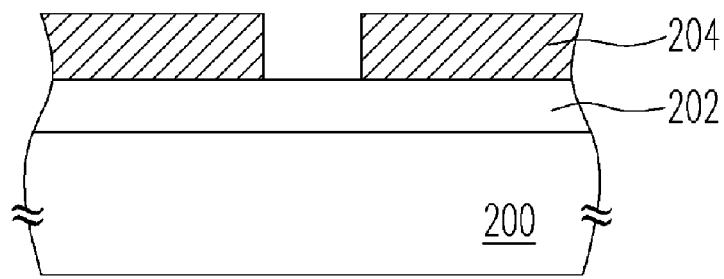
FIGS. 2A-2C are cross sectional views showing progress of a method of removing photoresist according to an embodiment of the present invention.
Figure 2B:
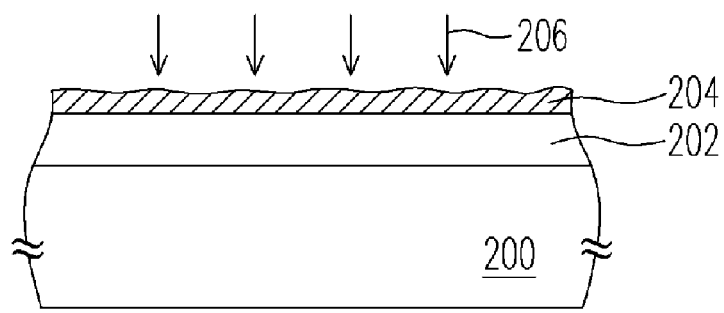
Figure 2C:
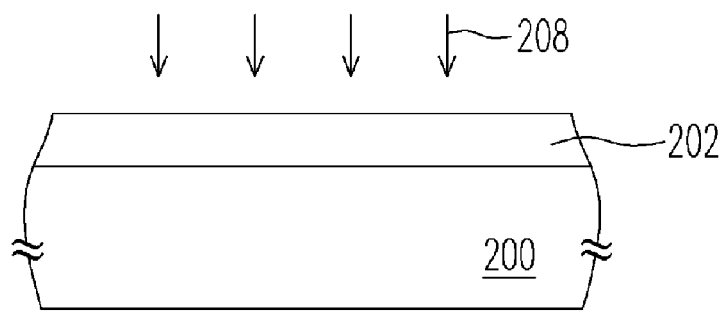

Following are descriptions of the method of removing photoresist according to the present invention. FIGS. 2A-2C are cross sectional views showing progress of a method of removing photoresist according to an embodiment of the present invention.

Referring to FIG. 2A, a substrate 200 is provided. A material layer 202 is formed over the substrate 200. The material layer 202 can be a to-be-patterned material layer which can be a dielectric material layer, a conductive material layer or other material layer, for example. The material layer 202 can also be a to-be-implanted material layer, which can be a silicon substrate, a dielectric layer or a conductive layer, for example. The material of the material layer 202 of the present invention is not specifically limited as long as the subsequent process performed to the material comprises a process using a photoresist layer.

Then, a photoresist layer 204 is formed over the material layer 202, wherein the material of the photoresist layer 204 can be a photosensitive material that is a mixture of resin, a sensitizer and a solvent, for example. The method of forming the photoresist layer 204 comprises, for example, spin coating the photosensitive material over the material layer 202; and soft baking the photosensitive material to remove the solvent within the photosensitive material. As a result, the liquid photosensitive material can be solidified and becomes a photoresist layer.

The photoresist layer 204 is then patterned to form a patterned photoresist layer 204. A semiconductor process such as an etch process, an ion implantation process or other process which requires the use of the photoresist layer is performed.

Referring to FIG. 2B, after the semiconductor process described above, the photoresist layer 204 must be completely removed for the subsequent process. In the method of the present invention, the whole photoresist is removed without using plasma. By using the solution with an organic solvent, the removal step 206 is performed to remove the photoresist layer 204.

Referring to FIG. 2C, a solution with an organic solvent is used to perform a removal step 208 to completely remove the photoresist layer 204.

Note that the polarity of the solution of step 206 is different from that of the solution of step 208. Moreover, the polarity of the solution of the removal step 206 is larger than that of the solution of the removal step 208. The removal step 206 with the higher polarity organic solution has a higher removal rate of the photoresist layer 204. The removal step 206 can remove most of the photoresist material. The removal step 208 with the lower polarity organic solution can remove the remaining photoresist material and the residual of the organic solution. By performing the removal steps 206 and 208 with the organic solutions, the photoresist thus is completely removed.

In an embodiment of the present invention, the organic solvent of the solution used in the removal step 206 can be, for example, N-methyl-2-pyrrolidone (NMP), and the temperature range of the solution is between about 23° C. and 50° C. The organic solvent of the solution sued in the removal step 208 can be, for example, cyclopentanone and the temperature range of the solution is between about 23° C. and 50° C. These organic solvents are chemical solutions used in general processes. Accordingly, without developing a new chemical solution and increasing additional costs, photoresist can be completely removed.

In detail, the removal step 206 is performed with the organic solution to remove the photoresist in the present invention. The photoresist layer 204, the material layer 202 and the substrate 200 shown in FIG. 1A are immersed in an environment with the organic solution, such as a container with an NMP solution. The NMP reacts with the photoresist layer 204 so that the photoresist layer 204 dissolves in the NMP solution to achieve the purpose of removing photoresist. Then, the removal step 208 is performed with the organic solution which has a polarity lower than that of the solution used in the removal step 206 to remove the photoresist. The photoresist layer 204, the material layer 202 thereunder and the substrate 200 shown in FIG. 1A are immersed in the container or a bath with the low polarity organic solution, such as a container with a cyclopentanone solution. The cyclopentanone solution reacts with the photoresist layer 204 so that the photoresist layer 204 dissolves in the cyclopentanone solution to remove photoresist. Since these two organic solutions have different polarities, and the polarity of the organic solution used in the removal step 206 is larger than that used in the removal step 208, the photoresist can be completely removed.

Note that the method of the removing photoresist of the present invention is different from that of prior art technology which requires plasma to strip photoresist. The process time and manufacturing costs to remove photoresist thus can be reduced. In other words, the method of removing photoresist of the present invention can be combined with a traditional photolithographic process and performed in a photolithography area without transferring wafers to other areas. As a result, the process time and manufacturing costs of removing photoresist are reduced, and the throughput of the whole process is enhanced.

Following are descriptions of a photoresist rework method according to the method of removing photoresist of the present invention. FIGS. 3A-3D are cross sectional views showing progress of a photoresist rework method according to an embodiment of the present invention.

Figure 3A:
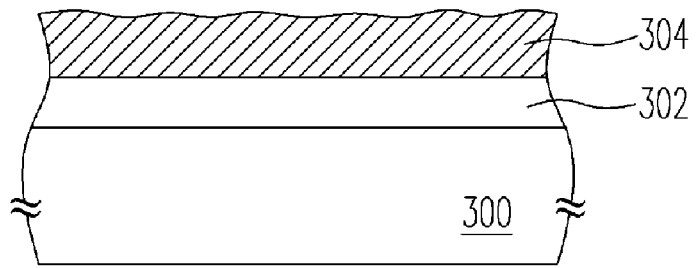
FIGS. 3A-3D are cross sectional views showing progress of a photoresist rework method according to an embodiment of the present invention.

First, referring to FIG. 3A, a substrate 300 is provided. A material layer 302 is formed over the substrate 300, and a photoresist layer 304 is formed over the material layer 302. The photoresist layer 304 is a defective photoresist material layer and should be reworked.

Figure 3B:
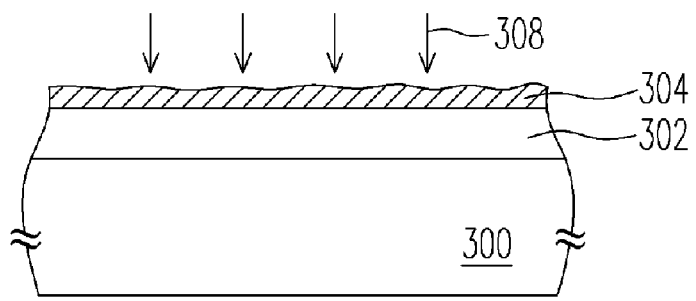

Referring to FIG. 3B, a solution with an organic solvent is used to perform the removal step 308 to remove the photoresist layer 304.

Figure 3C:
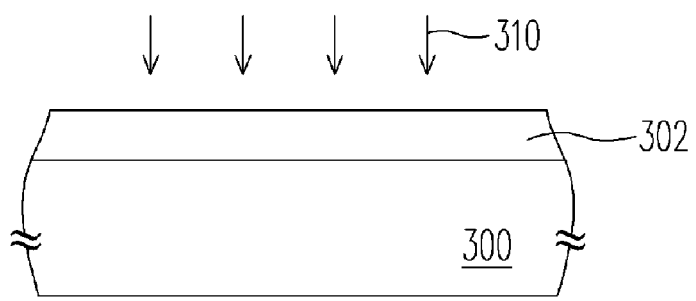

Referring to FIG. 3C, a solution with an organic solvent is used to perform the removal step 310 to completely remove the photoresist layer 304. Particularly, the solutions of the removal steps 308 and 310 have different polarities. Moreover, the polarity of the solution used in the removal step 308 is larger than that used in the removal step 310.

In an embodiment of the present invention, the organic solvent of the solution used in the removal step 308 can be, for example, N-methyl-2-pyrrolidone (NMP), and the temperature range of the solution of the removal step 308 is between about 23° C. and about 50° C. The organic solvent of the solution sued in the removal step 310 can be, for example, cyclopentanone and the temperature range of the solution of the removal step 308 is between about 23° C. and 50° C. These organic solvents are chemical solutions used in general processes. Accordingly, without developing a new chemical solution and increasing additional costs, photoresist can be completely removed.

Figure 3D:
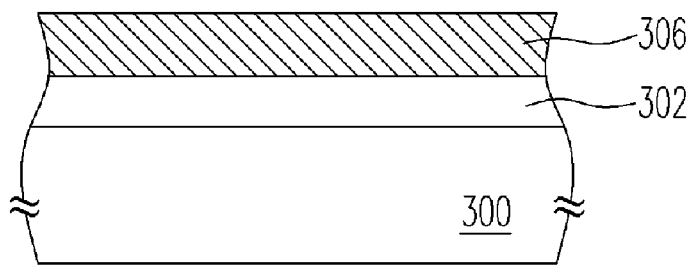

Referring to FIG. 3D, after the removal of the photoresist layer 304, another photoresist layer 306 is formed over the material layer 302. If defect occurs in the photoresist layer 306, the photoresist rework method described in the embodiment above can be repeated until a desired photoresist layer without defect is formed.

In the present invention, two removal steps with chemical solutions are performed. These chemical solutions have different polarities so that the photoresist can be completely removed. In addition, these chemical solutions are generally used in manufacturing processes. The manufacturing costs are thus reduced.

In the method of removing photoresist of the present invention, photoresist can be completely removed without using plasma. The process time is thus shortened and the manufacturing costs are further reduced.

In the method of the present invention, the process can be performed in a photolithography area without transferring wafers to other areas for processing. Accordingly, the process time is reduced and the throughput is enhanced.

Except photoresist rework, the photoresist removal method of the present invention can be also widely applied to the general process of removing photoresist.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of removing photoresist, comprising:
   without using plasma;
   using a first solution to perform a first removal step to a photoresist layer; and
   using a second solution to perform a second removal step to the photoresist layer so as to completely remove the photoresist layer, wherein the first solution and the second solution have different polarities.

2. The method of removing photoresist of claim 1, wherein a polarity of the first solution is larger than a polarity of the second solution.

3. The method of removing photoresist of claim 1, wherein the first solution is a solution with an organic solvent.

4. The method of removing photoresist of claim 3, wherein the organic solvent comprises N-methyl-2-pyrrolidone (NMP).

5. The method of removing photoresist of claim 1, wherein the second solution is a solution with an organic solvent.

6. The method of removing photoresist of claim 5, wherein the organic solvent comprises cyclopentanone.

7. The method of removing photoresist of claim 1, wherein a temperature of the first solution of the first removal step is between about 23° C. and 50° C.

8. The method of removing photoresist of claim 1, wherein a temperature of the second solution of the second removal step is between about 23° C. and 50° C.

9. A photoresist rework method, adapted for a substrate with a defective photoresist layer thereon, the method comprising:
   without using plasma;
   using a first solution to perform a first removal step to the defective photoresist layer;
   using a second solution to perform a second removal step to the defective photoresist layer so as to completely remove the defective photoresist layer, wherein the first solution and the second solution have different polarities; and
   forming a photoresist layer over the substrate.

10. The photoresist rework method of claim 9, wherein a polarity of the first solution is larger than a polarity of the second solution.

11. The photoresist rework method of claim 9, wherein the first solution is a solution with an organic solvent.

12. The photoresist rework method of claim 11, wherein the organic solvent comprises N-methyl-2-pyrrolidone (NMP).

13. The photoresist rework method of claim 9, wherein the second solution is a solution with an organic solvent.

14. The photoresist rework method of claim 13, wherein the organic solvent comprises cyclopentanone.

15. The photoresist rework method of claim 9, wherein a temperature of the first solution of the first removal step is between about 23° C. and 50° C.

16. The photoresist rework method of claim 9, wherein a temperature of the second solution of the second removal step is between about 23° C. and 50° C.

* * * * *